United States Patent
Sawada

(10) Patent No.: US 10,530,359 B2
(45) Date of Patent: Jan. 7, 2020

(54) OUTPUT BUFFER CIRCUIT, OSCILLATOR, ELECTRONIC APPARATUS, AND VEHICLE

(71) Applicant: Seiko Epson Corporation, Tokyo (JP)

(72) Inventor: Mitsuaki Sawada, Fujimi (JP)

(73) Assignee: Seiko Epson Corporation (JP)

(*) Notice: Subject to any disclaimer, the term of this patent is extended or adjusted under 35 U.S.C. 154(b) by 0 days.

(21) Appl. No.: 16/392,717

(22) Filed: Apr. 24, 2019

(65) Prior Publication Data

US 2019/0334519 A1    Oct. 31, 2019

(30) Foreign Application Priority Data

Apr. 25, 2018    (JP) .................................. 2018-084516

(51) Int. Cl.
| | |
|---|---|
| *H03K 17/16* | (2006.01) |
| *H03L 1/02* | (2006.01) |
| *H03B 5/36* | (2006.01) |
| *H03B 5/04* | (2006.01) |

(52) U.S. Cl.
CPC ............. *H03K 17/167* (2013.01); *H03B 5/04* (2013.01); *H03B 5/368* (2013.01); *H03L 1/023* (2013.01)

(58) Field of Classification Search
CPC ........ H03K 17/167; H03B 5/04; H03B 5/368; H03L 1/023

USPC ........................................................... 326/26
See application file for complete search history.

(56) References Cited

U.S. PATENT DOCUMENTS

| | | | |
|---|---|---|---|
| 5,371,420 A | 12/1994 | Nakao | |
| 6,285,214 B1* | 9/2001 | Zipper | .................... H03F 3/345 326/80 |
| 6,794,909 B1 | 9/2004 | Urakami et al. | |
| 8,710,933 B2 | 4/2014 | Nakamura et al. | |
| 2007/0200598 A1* | 8/2007 | Bennett | ............ H03K 19/00315 326/83 |
| 2011/0260756 A1* | 10/2011 | Agut | .................. H03K 19/0013 327/81 |

FOREIGN PATENT DOCUMENTS

| | | |
|---|---|---|
| JP | H05-102826 A | 4/1993 |
| JP | H05-276004 A | 10/1993 |
| JP | 2004-320231 A | 11/2004 |
| JP | 2012-257183 A | 12/2012 |

\* cited by examiner

*Primary Examiner* — Don P Le
(74) *Attorney, Agent, or Firm* — Harness, Dickey & Pierce, P.L.C.

(57) ABSTRACT

An output buffer circuit includes an output node, a P-type transistor, an N-type transistor, and a first variable resistor circuit provided in a signal path between a drain of one of the P-type transistor and the N-type transistor and the output node.

6 Claims, 9 Drawing Sheets

OUTPUT BUFFER CIRCUIT, OSCILLATOR, ELECTRONIC APPARATUS, AND VEHICLE

The present application is based on and claims priority from Japanese Patent Application Serial Number 2018-084516, filed Apr. 25, 2018, the disclosure of which is hereby incorporated by reference herein in its entirety.

BACKGROUND

1. Technical Field

The present disclosure relates to an output buffer circuit, an oscillator, an electronic apparatus, and a vehicle.

2. Related Art

JP-A-2012-257183 discloses an oscillation circuit including an output circuit having a plurality of MOSFET circuits arranged in parallel and to which a signal from an oscillation output generation circuit is input, in which the outputs of the MOSFET circuits which have not been selected are set to a high impedance. According to the output circuit, output characteristics such as rise time and fall time of an output signal can be adjusted by changing the drive capability of the load.

However, in the output circuit described in JP-A-2012-257183, since the output characteristic is influenced by an output waveform of a circuit in the preceding stage driving the MOSFET, it is necessary to adjust the drive capability of the circuit in the preceding stage. That is, in the output circuit described in JP-A-2012-257183, there has been a problem that complex and multiple adjustments are required.

SUMMARY

An output buffer circuit according to an aspect of the present disclosure includes an output node, a P-type transistor, an N-type transistor, and a first variable resistor circuit provided in a signal path between a drain of one of the P-type transistor and the N-type transistor and the output node.

In the output buffer circuit according to the aspect of the present disclosure, the first variable resistor circuit may include a first resistor, a second resistor, and a first switching circuit coupled in series to the second resistor, and the first resistor may be coupled in parallel to the second resistor and the first switching circuit.

In the output buffer circuit according to the aspect of the present disclosure, the first switching circuit may include a first transistor, and the second resistor may be provided in a signal path between the first transistor and the output node.

The output buffer circuit according to the aspect of the present disclosure may further include a second variable resistor circuit provided in a signal path between a drain of the other of the P-type transistor and the N-type transistor and the output node.

In the output buffer circuit according to the aspect of the present disclosure, the second variable resistor circuit may include a third resistor, a fourth resistor, and a second switching circuit coupled in series to the fourth resistor, and the third resistor may be coupled in parallel to the fourth resistor and the second switching circuit.

In the output buffer circuit according to the aspect of the present disclosure, the second switching circuit may include a second transistor, and the fourth resistor may be provided in a signal path provided between the second transistor and the output node.

An oscillator according to an aspect of the present disclosure includes the output buffer circuit according to the aspect of the present disclosure, and an oscillation circuit that outputs an oscillation signal as a source of a signal input to the output buffer circuit.

An electronic apparatus according to an aspect of the present disclosure includes the output buffer circuit according to the aspect of the present disclosure.

A vehicle according to an aspect of the present disclosure includes the output buffer circuit according to the aspect of the present disclosure.

DESCRIPTION OF EXEMPLARY EMBODIMENTS

Hereinafter, a preferable embodiment of the present disclosure will be described in details with reference to the drawings. The embodiments described below do not in any way limit the scope of the present disclosure described in the appended claims. Moreover, all of the configurations of the embodiments described below should not necessarily be taken as essential components for the present disclosure.

1. Output Buffer Circuit

1-1. Configuration of Output Buffer Circuit

Figure 1:
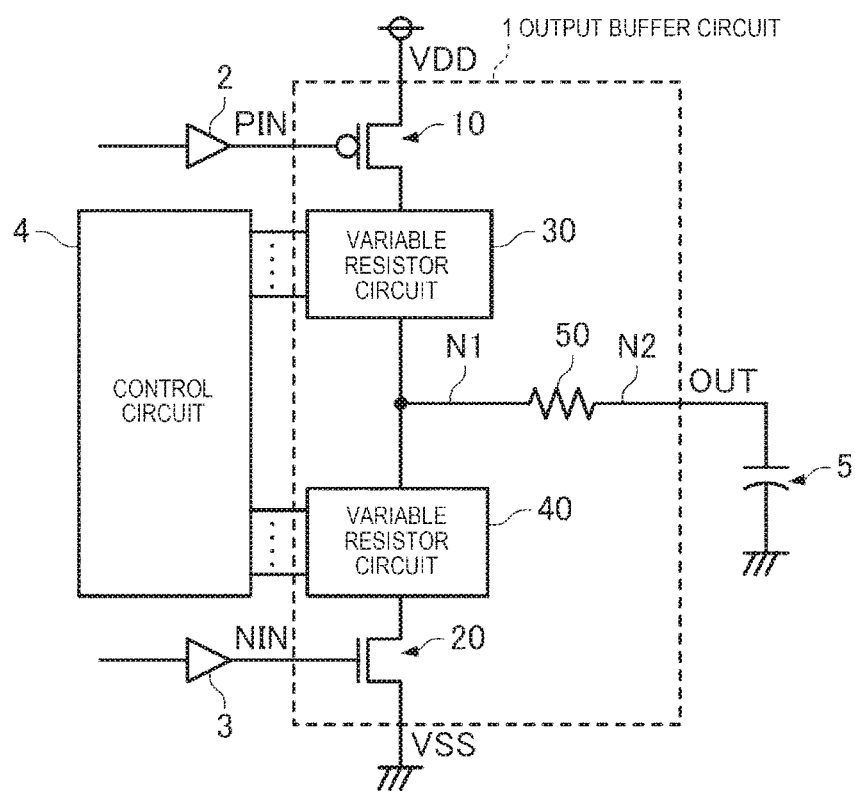
FIG. 1 is a diagram showing a configuration of an output buffer circuit of an embodiment.

FIG. 1 is a diagram showing a configuration of an output buffer circuit 1 of the present embodiment. As shown in FIG. 1, the output buffer circuit 1 of the present embodiment includes a P-type transistor 10, which is a P-channel type metal oxide semiconductor field effect transistor (MOSFET), an N-type transistor 20, which is an N-channel type MOSFET, two variable resistor circuits 30 and 40, and a resistor 50.

A power supply voltage VDD is supplied to a source of the P-type transistor 10, and an output signal of a pre-buffer 2 is supplied to a gate of the P-type transistor 10 as an input signal PIN of the output buffer circuit 1. When the input signal PIN is at a low level, a source and a drain of the P-type transistor 10 are conducted, and the drain has a voltage substantially equal to the power supply voltage VDD. When the input signal PIN is at a high level, the source and the drain of the P-type transistor 10 are nonconductive, and the drain is at a high impedance.

A ground voltage VSS is supplied to the source of the N-type transistor 20, and an output signal of a pre-buffer 3 is supplied to the gate of the N-type transistor 20 as an input signal NIN of the output buffer circuit 1. When the input signal NIN is at the high level, the source and the drain of the N-type transistor 20 are conducted, and the drain has a voltage substantially equal to the ground voltage VSS. When the input signal NIN is at the low level, the source and the drain of the N-type transistor 20 are nonconductive, and the drain is at the high impedance.

The variable resistor circuit 30 is provided in a signal path between the drain of the P-type transistor 10 and an output node N2 of the output buffer circuit 1. Specifically, the variable resistor circuit 30 is electrically coupled between the drain of the P-type transistor 10 and an internal node N1 of the output buffer circuit 1. In the variable resistor circuit 30, a resistance value changes according to a control signal supplied from a control circuit 4.

The variable resistor circuit 40 is provided in a signal path between the drain of the N-type transistor 20 and the output node N2. Specifically, the variable resistor circuit 40 is electrically coupled between the drain of the N-type transistor 20 and the internal node N1. In the variable resistor circuit 40, the resistance value changes according to the control signal supplied from the control circuit 4.

The resistor 50 is electrically coupled between the internal node N1 and the output node N2.

A load capacitance 5 is a gate capacitance, a parasitic capacitance, and the like of a circuit in the subsequent stage coupled to the output node N2 of the output buffer circuit 1. When the resistance value of the variable resistor circuit 30 and the resistance value of the variable resistor circuit 40 are fixed, the rise time and fall time of an output signal OUT (that is, a signal output from the output node N2) of the output buffer circuit 1 becomes longer as the load capacitance 5 is larger. The rise time of the output signal OUT is, for example, the time required for the voltage of the output signal OUT to raise from 10% to 90% of the difference between the power supply voltage VDD and the ground voltage VSS. The fall time of the output signal OUT is, for example, the time required for the voltage of the output signal OUT to decrease from 90% to 10% of the difference between the power supply voltage VDD and the ground voltage VSS.

1-2. Configuration of Variable Resistor Circuit

Figure 2:
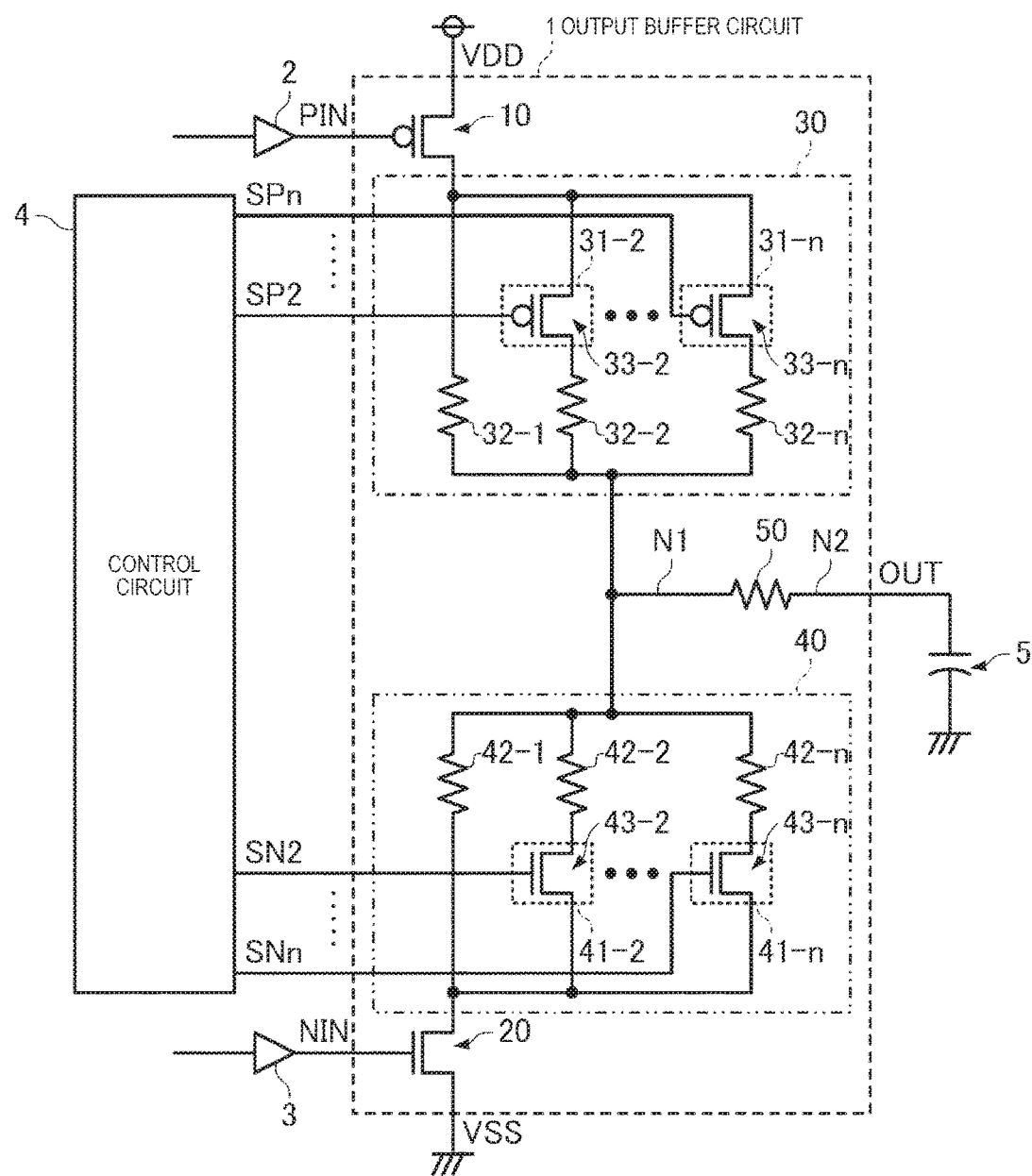
FIG. 2 is a diagram showing a configuration example of variable resistor circuits.

FIG. 2 is a diagram showing a configuration example of variable resistor circuits 30 and 40. In FIG. 2, not only the variable resistor circuits 30 and 40 but also the respective constituents shown in FIG. 1 are shown, and the respective constituents are given the same reference numerals as those in FIG. 1.

In the example of FIG. 2, the variable resistor circuit 30 includes an n−1 number of switching circuits 31-2 to 31-n and an n number of resistors 32-1 to 32-n.

The switching circuit 31-i (i is a number from 2 to n) is coupled in series to the resistor 32-i. In the variable resistor circuit 30, the resistor 32-1 is coupled in parallel to the resistor 32-i and the switching circuit 31-i.

The switching circuit 31-i opens and closes in response to a control signal SPi supplied from the control circuit 4. When the switching circuit 31-i closes, the drain of the P-type transistor 10 is electrically coupled to one end of the resistor 32-i, and when the switching circuit 31-i opens, the drain of the P-type transistor 10 is not electrically coupled to one end of the resistor 32-i.

In the example of FIG. 2, the switching circuit 31-i includes a P-type transistor 33-i. The resistor 32-i is provided in a signal path between the P-type transistor 33-i and the output node N2. Specifically, one end of the resistor 32-i is electrically coupled to the drain of the P-type transistor 33-i, and the other end of the resistor 32-i is electrically coupled to the internal node N1. When the control signal SPi is supplied to the gate of the P-type transistor 33-i, and the control signal SPi is at the low level, the source and the drain of the P-type transistor 33-i are conducted, and the drain of the P-type transistor 10 is electrically coupled to one end of the resistor 32-i. When the control signal SPi is at the high level, the source and the drain of the P-type transistor 33-i are nonconductive, so that the drain of the P-type transistor 10 is not electrically coupled to one end of the resistor 32-i.

The resistor 32-1 is electrically coupled between the drain of the P-type transistor 10 and the internal node N1.

Figure 3:
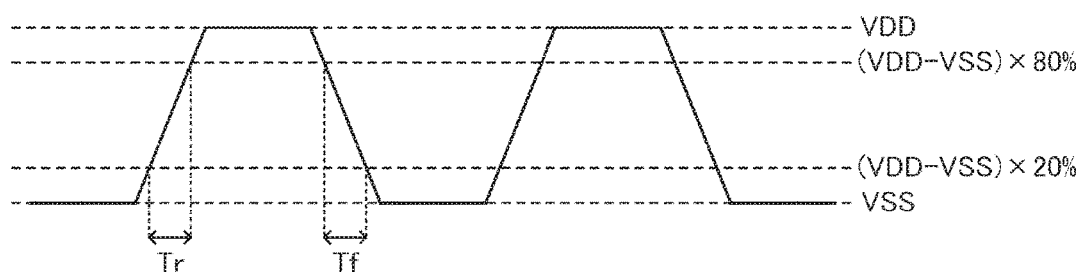
FIG. 3 is a diagram showing an example of a waveform of an output signal of the output buffer circuit.
Figure 4:
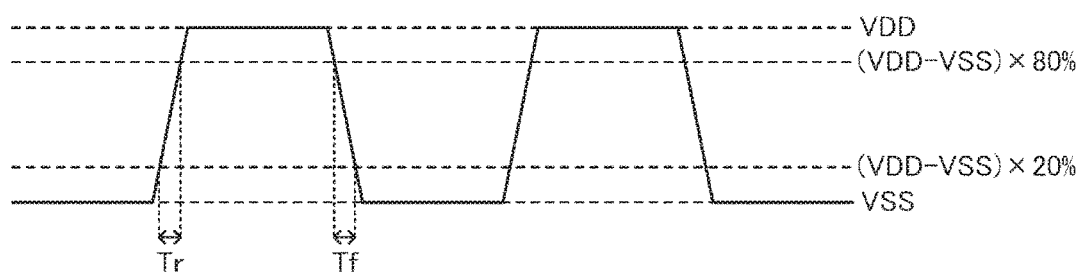
FIG. 4 is a diagram showing another example of a waveform of an output signal of the output buffer circuit.

In the variable resistor circuit 30 having such a configuration, the resistance value $R_{DP}$ changes according to the logic level of an n−1 number of control signals SP2 to SPn supplied from the control circuit 4. As the resistance value $R_{DP}$ of the variable resistor circuit 30 increases, the sum of the resistance value $R_P$ of the ON resistor of the P-type transistor 10, the resistance value $R_{DP}$, and the resistance value $R_S$ of the resistor 50 increases, so that the time constant $RC_P$ calculated from the product of the sum of the resistance value $R_P$, the resistance value $R_{DP}$, and the resistance value $R_S$ and the capacitance value $C_L$ of the load capacitance 5 increases. As a result, as shown in FIG. 3, the rise of the waveform of the output signal OUT becomes gentle, and the rise time Tr becomes longer. As the resistance value $R_{DP}$ of the variable resistor circuit 30 decreases, the sum of the resistance value $R_P$, the resistance value $R_{DP}$, and the resistance value $R_S$ decreases, so that the time constant $RC_P$ decreases. As a result, as shown in FIG. 4, the rise of the waveform of the output signal OUT becomes steep, and the rise time Tr becomes shorter.

The variable resistor circuit 40 includes an n−1 number of switching circuits 41-2 to 41-n and an n number of resistors 42-1 to 42-n.

The switching circuit 41-j (j is a number from 2 to n) is coupled in series to the resistor 42-j. In the variable resistor circuit 40, the resistor 42-1 is coupled in parallel to the resistor 42-j and the switching circuit 41-j.

The switching circuit 41-j opens and closes in response to a control signal SNi supplied from the control circuit 4. When the switching circuit 41-j closes, the drain of the N-type transistor 20 is electrically coupled to one end of the resistor 42-j, and when the switching circuit 41-j opens, the drain of the N-type transistor 20 is not electrically coupled to one end of the resistor 42-j.

In the example of FIG. 2, the switching circuit 41-j includes an N-type transistor 43-j. The resistor 42-j is provided in a signal path between the N-type transistor 43-j and the output node N2. Specifically, one end of the resistor 42-j is electrically coupled to the drain of the N-type transistor 43-j, and the other end of the resistor 42-j is electrically coupled to the internal node N1. When the control signal SNj is supplied to the gate of the N-type transistor 43-j, and the control signal SNj is at the high level, the source and the drain of the N-type transistor 43-j are conducted, and the drain of the N-type transistor 20 is electrically coupled to one end of the resistor 42-j. When the control signal SNj is at the low level, the source and the drain of the N-type transistor 43-j are nonconductive, and the drain of the N-type transistor 20 is not electrically coupled to one end of the resistor 42-j.

The resistor 42-1 is electrically coupled between the drain of the N-type transistor 20 and the internal node N1.

In the variable resistor circuit 40 having such a configuration, the resistance value $R_{DN}$ changes according to the logic level of an n−1 number of control signals SN2 to SNn supplied from the control circuit 4. As the resistance value $R_{DN}$ of the variable resistor circuit 40 increases, the sum of the resistance value $R_N$ of the ON resistor of the N-type transistor 20, the resistance value $R_{DN}$, and the resistance value $R_S$ increases, so that the time constant $RC_N$ calculated from the product of the sum of the resistance value $R_N$, the resistance value $R_{DN}$, and the resistance value $R_S$ and the capacitance value $C_L$ increases. As a result, as shown in FIG. 3, the fall of the waveform of the output signal OUT becomes gentle, and the fall time Tf becomes longer. As the resistance value $R_{DN}$ of the variable resistor circuit 40 decreases, the sum of the resistance value $R_N$, the resistance value $R_{DN}$, and the resistance value $R_S$ decreases, and the time constant $RC_N$ decreases. As a result, as shown in FIG. 4, the fall of the waveform of the output signal OUT becomes steep, and the fall time Tf becomes shorter.

In FIG. 2, the variable resistor circuit 30 is an example of a "first variable resistor circuit" according to the present disclosure. The resistor 32-1 is an example of a "first resistor" according to the present disclosure, and the resistors 32-2 to 32-n are each an example of a "second resistor" according to the present disclosure. The switching circuits 31-2 to 31-n are each an example of a "first switching circuit" according to the present disclosure, and the P-type transistors 33-2 to 33-n are each an example of a "first transistor" according to the present disclosure. The variable resistor circuit 40 is an example of a "second variable resistor circuit" according to the present disclosure. The resistor 42-1 is an example of a "third resistor" according to the present disclosure, and the resistors 42-2 to 42-n are each an example of a "fourth resistor" according to the present disclosure. The switching circuits 41-2 to 41-n are each an example of a "second switching circuit" according to the present disclosure, and the N-type transistors 43-2 to 43-n are each an example of a "second transistor" according to the present disclosure.

Alternatively, the variable resistor circuit 40 is another example of the "first variable resistor circuit" according to the present disclosure. The resistor 42-1 is another example of the "first resistor" according to the present disclosure, and the resistors 42-2 to 42-n are each another example of the "second resistor" according to the present disclosure. The switching circuits 41-2 to 41-n are each another example of the "first switching circuit" according to the present disclosure, and the N-type transistors 43-2 to 43-n are each another example of the "first transistor" according to the present disclosure. The variable resistor circuit 30 is another example of the "second variable resistor circuit" according to the present disclosure. The resistor 32-1 is another example of the "third resistor" according to the present disclosure, and the resistors 32-2 to 32-n are each another example of the "fourth resistor" according to the present disclosure. The switching circuits 31-2 to 31-n are each another example of the "second switching circuit" according to the present disclosure, and the P-type transistors 33-2 to 33-n are each another example of the "second transistor" according to the present disclosure.

Figure 5:
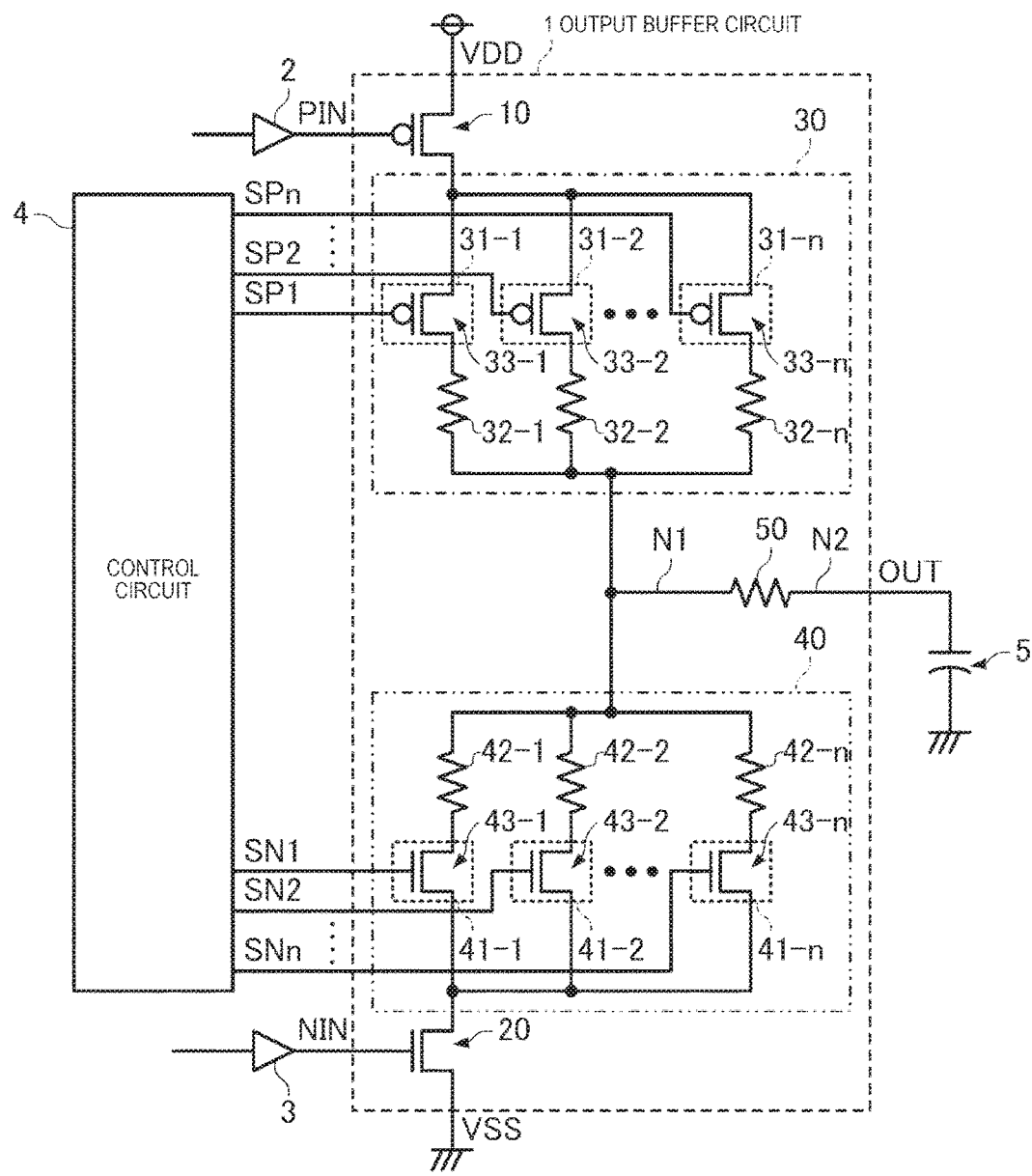
FIG. 5 is a diagram showing another configuration example of the variable resistor circuits.

FIG. 5 is a diagram showing another configuration example of the variable resistor circuits 30 and 40. In FIG. 5, the same reference numerals are given to the same constituents as those in FIG. 2, and in the following description of FIG. 5, a description overlapping with FIG. 2 will be omitted.

In the example of FIG. 5, the variable resistor circuit 30 includes an n number of switching circuits 31-1 to 31-n and the n number of resistors 32-1 to 32-n. As in the example of FIG. 2, the n−1 number of switching circuits 31-2 to 31-n include the P-type transistors 33-2 to 33-n, respectively, and the connection relationship between the n−1 number of P-type transistors 33-2 to 33-n and the n−1 number of resistors 32-2 to 32-n is the same as in the example of FIG. 2.

The example of FIG. 5 is different from the example of FIG. 2 in that a switching circuit 31-1 is further provided in the variable resistor circuit 30. The switching circuit 31-1 is coupled in series to the resistor 32-1. The switching circuit 31-1 opens and closes in response to a control signal SP1 supplied from the control circuit 4. When the switching circuit 31-1 closes, the drain of the P-type transistor 10 is electrically coupled to one end of the resistor 32-1, and when the switching circuit 31-1 opens, the drain of the P-type transistor 10 is not electrically coupled to one end of the resistor 32-1.

In the example of FIG. 5, the switching circuit 31-1 includes a P-type transistor 33-1. One end of the resistor 32-1 is electrically coupled to the drain of the P-type transistor 33-1, and the other end of the resistor 32-1 is electrically coupled to the internal node N1. When the control signal SP1 is supplied to the gate of the P-type transistor 33-1, and the control signal SP1 is at the low level, the source and the drain of the P-type transistor 33-1 are conducted, and the drain of the P-type transistor 10 is electrically coupled to one end of the resistor 32-1. When the control signal SP1 is at the high level, the source and drain of the P-type transistor 33-1 are nonconductive, and the drain of the P-type transistor 10 is not electrically coupled to one end of the resistor 32-1.

In the variable resistor circuit 30 having such a configuration, the resistance value $R_{DP}$ changes according to the logic level of an n number of control signals SP1 to SPn supplied from the control circuit 4. As the resistance value $R_{DP}$ of the variable resistor circuit 30 increases, the sum of the resistance value $R_P$ of the ON resistor of the P-type transistor 10, the resistance value $R_{DP}$, and the resistance value $R_S$ of the resistor 50 increases, so that the time constant $RC_P$ calculated from the product of the sum of the resistance value $R_P$, the resistance value $R_{DP}$, and the resistance value $R_S$ and the capacitance value $C_L$ of the load capacitance 5 increases. As a result, as shown in FIG. 3, the rise of the waveform of the output signal OUT becomes gentle, and the rise time Tr becomes longer. As the resistance value $R_{DP}$ of the variable resistor circuit 30 decreases, the sum of the resistance value $R_P$, the resistance value $R_{DP}$, and the resistance value $R_S$ decreases, so that the time constant $RC_P$ decreases. As a result, as shown in FIG. 4, the rise of the waveform of the output signal OUT becomes steep, and the rise time Tr becomes shorter.

The variable resistor circuit 40 includes an n number of switching circuits 41-1 to 41-n and the n number of resistors 42-1 to 42-n. As in the example of FIG. 2, the n−1 number of switching circuits 41-2 to 41-n include the N-type transistors 43-2 to 43-n, respectively, and the connection relationship between the n−1 number of N-type transistors 43-2 to 43-n and the n−1 number of resistors 42-2 to 42-n is the same as in the example of FIG. 2.

The example of FIG. 5 is different from the example of FIG. 2 in that a switching circuit 41-1 is further provided in the variable resistor circuit 40. The switching circuit 41-1 is coupled in series to the resistor 42-1. The switching circuit 41-1 opens and closes in response to a control signal SN1 supplied from the control circuit 4. When the switching circuit 41-1 closes, the drain of the N-type transistor 20 is electrically coupled to one end of the resistor 42-1, and when the switching circuit 41-1 opens, the drain of the N-type transistor 20 is not electrically coupled to one end of the resistor 42-1.

In the example of FIG. 5, the switching circuit 41-1 includes an N-type transistor 43-1. One end of the resistor 42-1 is electrically coupled to the drain of the N-type transistor 43-1, and the other end of the resistor 42-1 is electrically coupled to the internal node N1. When the control signal SN1 is supplied to the gate of the N-type transistor 43-1, and the control signal SN1 is at the high level, the source and the drain of the N-type transistor 43-1 are conducted, and the drain of the N-type transistor 20 is electrically coupled to one end of the resistor 42-1. When the control signal SN1 is at the low level, the source and the drain of the N-type transistor 43-1 are nonconductive, and the drain of the N-type transistor 20 is not electrically coupled to one end of the resistor 42-1.

In the variable resistor circuit 40 having such a configuration, the resistance value $R_{DN}$ changes according to the logic level of an n number of control signals SN1 to SNn supplied from the control circuit 4. As the resistance value $R_{DN}$ of the variable resistor circuit 40 increases, the sum of the resistance value $R_N$ of the ON resistor of the N-type transistor 20, the resistance value $R_{DN}$, and the resistance value $R_S$ increases, so that the time constant $RC_N$ calculated from the product of the sum of the resistance value $R_N$, the resistance value $R_{DN}$, and the resistance value $R_S$ and the capacitance value $C_L$ increases. As a result, as shown in FIG. 3, the fall of the waveform of the output signal OUT becomes gentle, and the fall time Tf becomes longer. As the resistance value $R_{DN}$ of the variable resistor circuit 40 decreases, the sum of the resistance value $R_N$, the resistance value $R_{DN}$, and the resistance value $R_S$ decreases, and the time constant $RC_N$ decreases. As a result, as shown in FIG. 4, the fall of the waveform of the output signal OUT becomes steep, and the fall time Tf becomes shorter.

1-3. Effects

Next, taking the output buffer circuit in the related art as a comparative example, the effects of the output buffer circuit 1 of the present embodiment will be described.

Figure 6:
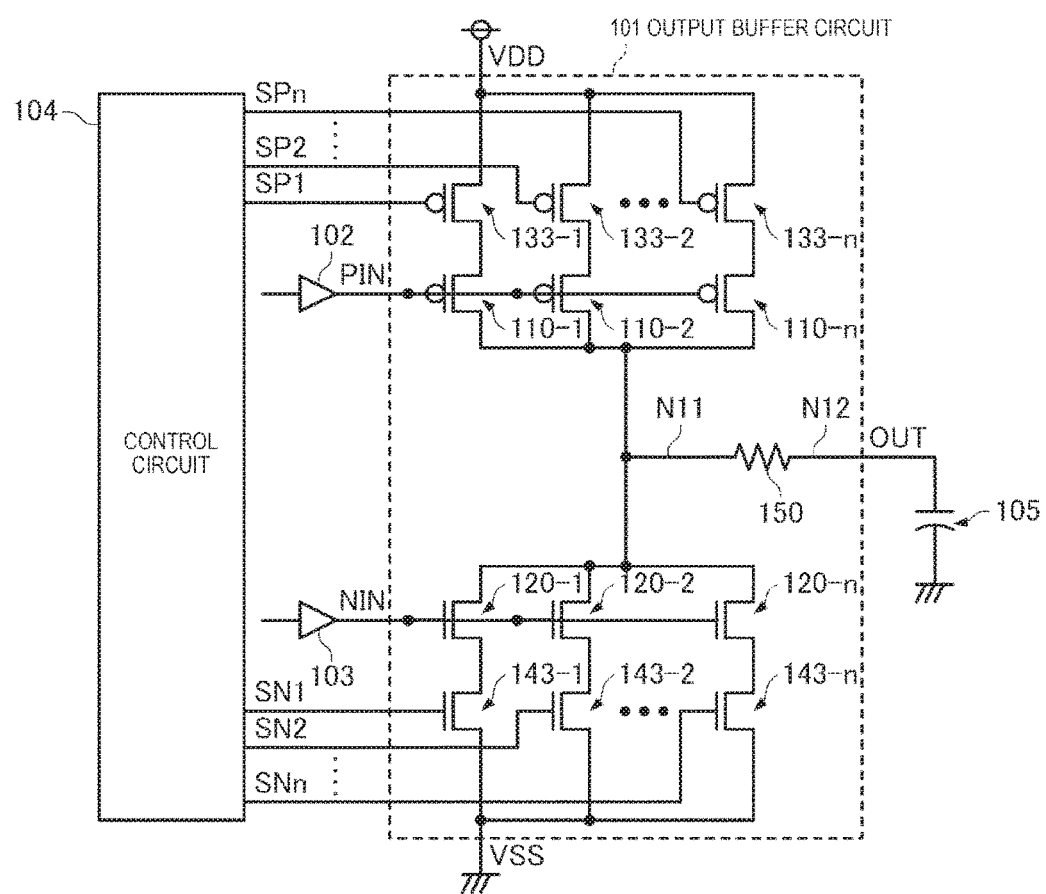
FIG. 6 is a diagram showing a configuration of an output buffer circuit of a comparative example.

FIG. 6 is a diagram showing a configuration of an output buffer circuit of a comparative example. As shown in FIG. 6, an output buffer circuit 101 of the comparative example includes an n number of P-type transistors 110-1 to 110-n, an n number of N-type transistors 120-1 to 120-n, an n number of P-type transistors 133-1 to 133-n, an n number of N-type transistors 143-1 to 143-n, and a resistor 150.

The power supply voltage VDD is supplied to the source of the P-type transistor 133-i (i is a number from 1 to n), the control signal SPi is supplied to the gate of the P-type transistor 133-i from a control circuit 104, and the drain of the P-type transistor 133-i is electrically coupled to the source of the P-type transistor 110-i. When the control signal SPi is at the low level, the source and the drain of the P-type transistor 133-i are conducted, and the drain has a voltage substantially equal to the power supply voltage VDD. When the control signal SPi is at the high level, the source and the drain of the P-type transistor 133-i are nonconductive, and the drain is at the high impedance.

An output signal of a pre-buffer 102 is supplied to the gate of the P-type transistor 110-i as the input signal PIN of the output buffer circuit 101, the source of the P-type transistor 110-i is electrically coupled to the drain of the P-type transistor 133-i, and the drain of the P-type transistor 110-i is electrically coupled to the internal node N11 of the output buffer circuit 101. When the input signal PIN is at the low level, the source and the drain of the P-type transistor 110-i are conducted. When the input signal PIN is at the high level, the source and the drain of the P-type transistor 110-i are nonconductive.

The ground voltage VSS is supplied to the source of the N-type transistor 143-j (j is a number from 1 to n), the control signal SNi is supplied to the gate of the N-type transistor 143-j from the control circuit 104, and the drain of the N-type transistor 143-j is electrically coupled to the source of the N-type transistor 120-j. When the control signal SNj is at the high level, the source and the drain of the N-type transistor 143-j are conducted, and the drain has a voltage substantially equal to the ground voltage VSS. When the control signal SNj is at the low level, the source and the drain of the N-type transistor 143-j are nonconductive, and the drain is at the high impedance.

An output signal of a pre-buffer 103 is supplied to the gate of the N-type transistor 120-j, as the input signal NIN of the output buffer circuit 101, the source of the N-type transistor 120-j is electrically coupled to the drain of the N-type transistor 143-j, and the drain of the N-type transistor 120-j is electrically coupled to the internal node N11. When the input signal NIN is at the high level, the source and the drain of the N-type transistor 120-j are conducted. When the input signal NIN is at the high level, the source and the drain of the N-type transistor 120-j are nonconductive.

The resistor 150 is electrically coupled between the internal node N11 and an output node N12 of the output buffer circuit 101.

A load capacitance 105 is a gate capacitance, a parasitic capacitance, and the like of a circuit in the subsequent stage coupled to the output node N12 of the output buffer circuit 101.

In the output buffer circuit 101 of the comparative example having such a configuration, among the P-type transistors 110-1 to 110-n, the number of P-type transistors coupled in parallel between a power source outputting the power supply voltage VDD and the internal node N1 changes according to the logic level of the n number of control signals SP1 to SPn supplied from the control circuit 104. As the number of P-type transistors coupled in parallel between the power source and the internal node N1 decreases, the current flowing from the power source to the internal node N1 decreases when the input signal PIN changes from the high level to the low level. As a result, the rise of the waveform of the output signal OUT of the output buffer circuit 101 becomes gentle, and the rise time Tr becomes longer. As the number of P-type transistors coupled in parallel between the power source and the internal node N1 increases, the current flowing from the power source to the internal node N1 increases when the input signal PIN changes from the high level to the low level. As a result, the rise of the waveform of the output signal OUT of the output buffer circuit 101 becomes steep, the rise time Tr becomes shorter.

In the output buffer circuit 101 of the comparative example, among the N-type transistors 120-1 to 120-*n*, the number of N-type transistors coupled in parallel between the internal node N1 and the ground changes according to the logic level of the n number of control signals SN1 to SNn supplied from the control circuit 104. As the number of N-type transistors coupled in parallel between the internal node N1 and the ground decreases, the current flowing from the internal node N1 to the ground decreases when the input signal NIN changes from the low level to the high level. As a result, the fall of the waveform of the output signal OUT of the output buffer circuit 101 becomes gentle, and the fall time Tf becomes longer. As the number of N-type transistors coupled in parallel between the internal node N1 and the ground increases, the current flowing from the internal node N1 to the ground increases when the input signal NIN changes from the low level to the high level. As a result, the fall of the waveform of the output signal OUT of the output buffer circuit 101 becomes steep, and the fall time Tf becomes shorter.

Here, as the number of P-type transistors coupled in parallel between the power source and the internal node N1 changes, the number of P-type transistors necessary to be driven by the pre-buffer 102 when the input signal PIN changes from the high level to the low level changes. Similarly, as the number of N-type transistors coupled in parallel between the internal node N1 and the ground changes, the number of N-type transistors necessary to be driven by the pre-buffer 103 when the input signal NIN changes from the low level to the high level changes. In the output buffer circuit 101 of the comparative example, the rise time Tr of the output signal OUT is changed by changing the number of P-type transistors driven by the pre-buffer 102, and the fall time Tf of the output signal OUT is changed by changing the number of N-type transistors driven by the pre-buffer 103. If the drive capabilities of the pre-buffers 102 and 103 are constant, it may be difficult to set the rise time Tr and the fall time Tf of the output signal OUT to desired times. Therefore, for example, in response to the control signals SP1 to SPn, the larger the number of P-type transistors coupled in parallel between the power source and the internal node N1, the more adjustment is needed to increase the drive capability of the pre-buffer 102. Similarly, in response to the control signals SN1 to SNn, the larger the number of N-type transistors coupled in parallel between the internal node N1 and the ground, the more adjustment is needed to increase the drive capability of the pre-buffer 103. That is, in the output buffer circuit 101 of the comparative example, in order to set the rise time Tr and the fall time Tf of the output signal OUT to desired times, complex and multiple adjustment is required.

On the contrary, in the output buffer circuit 1 of the present embodiment, since the pre-buffer 2 always drives only the P-type transistor 10, and the pre-buffer 3 always drives only the N-type transistor 20, it is unnecessary to adjust the drive capabilities of the pre-buffers 2 and 3. According to the output buffer circuit 1 of the present embodiment, it is easy to adjust the rise time Tr and the fall time Tf of the output signal OUT to desired times.

Figure 7:
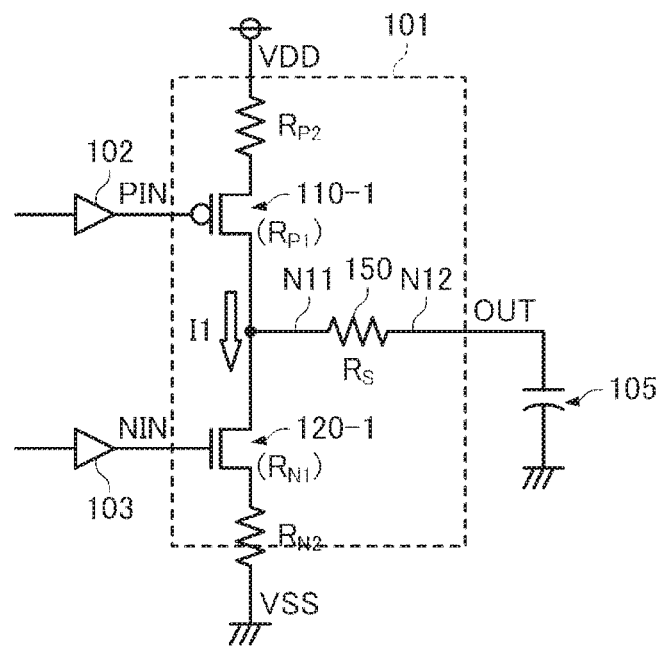
FIG. 7 is a diagram showing an example of an equivalent circuit of the output buffer circuit of the comparative example.
Figure 8:
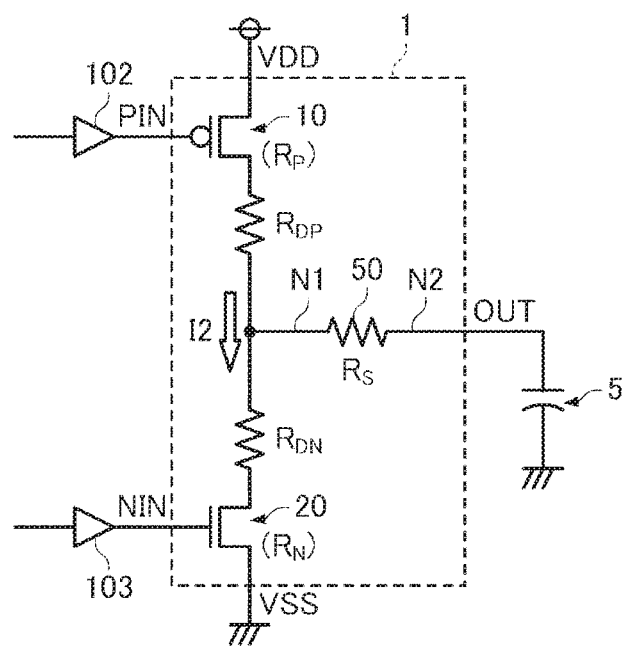
FIG. 8 is a diagram showing an example of an equivalent circuit of the output buffer circuit of the embodiment.

According to the output buffer circuit 1 of the present embodiment, a through-current flowing from the power source to the ground can be reduced more than that of the output buffer circuit 101 of the comparative example. The reduction effect of through-current by the output buffer circuit 1 will be described with reference to FIGS. 7 and 8. FIG. 7 is a diagram showing an equivalent circuit when the control signal SP1 is at the low level, the control signals SP2 to SPn are at the high level, the control signal SN1 is at the high level, and, the control signals SN2 to SNn are at the low level in the output buffer circuit 101 of the comparative example shown in FIG. 6. FIG. 8 is a diagram showing an equivalent circuit when the control signals SP2 to SPn are at the high level, and the control signals SN2 to SNn are at the low level in the output buffer circuit 1 shown in FIG. 2. FIG. 8 is also a diagram showing an equivalent circuit when the control signal SP1 is at the low level, the control signals SP2 to SPn are at the high level, the control signal SN1 is at the high level, and the control signals SN2 to SNn are at the low level in the output buffer circuit 1 shown in FIG. 5.

In FIG. 7, $R_{P1}$ is the value of the ON resistor of P-type transistor 110-1, and $R_{P2}$ is the value of the ON resistor of the P-type transistor 133-1. $R_{N1}$ is the value of the ON resistor of the N-type transistor 120-1, and $R_{N2}$ is the value of the ON resistor of the N-type transistor 143-1. In the output buffer circuit 101, when the period in which the logic level of the input signal PIN changes overlaps the period in which the logic level of the input signal NIN changes, and when the input signal PIN is at the low level and the input signal NIN is at the high level, the through-current I1= (VDD-VSS)/($R_{P1}+R_{P2}+R_{N1}+R_{N2}$) flows from the power source to the ground. When both the resistance value between the power source and the output node N12 and the resistance value between the ground and the output node N12 are designed to be 70Ω, if $R_{P1}=R_{P2}=R_{N1}=R_{N2}$=20Ω, $R_S$=30Ω. Therefore, if VDD=3.3 V and VSS=0 V, I1=41.25 mA.

In FIG. 8, $R_P$ is the value of the ON resistor of the P-type transistor 10, and $R_{DP}$ is the resistance value of the variable resistor circuit 30. $R_N$ is the value of the ON resistor of the N-type transistor 20, and $R_{DN}$ is the resistance value of the variable resistor circuit 40. In the output buffer circuit 1, when the period in which the logic level of the input signal PIN changes overlaps the period in which the logic level of the input signal NIN changes, and when the input signal PIN is at the low level and the input signal NIN is at the high level, the through-current I2=(VDD-VSS)/($R_P+R_{DP}+R_N+R_{DN}$) flows from the power source to the ground. When both the resistance value between the power source and the output node N2 and the resistance value between the ground and the output node N2 are designed to be 70Ω, if $R_P=R_N$=20Ω, for example, $R_{DP}=R_{DN}$=40Ω, $R_S$=10Ω can be satisfied. Therefore, when VDD=3.3 V and VSS=0 V, I2=27.5 mA. That is, according to the output buffer circuit 1 of the present embodiment, the through-current I2 can be made smaller than the through-current I1 of the output buffer circuit 101 of the comparative example.

In the output buffer circuit 101 shown in FIG. 7, the resistor 150 is the only electrostatic protection resistor which protects the P-type transistors 110-1 to 110-*n* and the N-type transistors 120-1 to 120-*n* against the static electricity from the output node N12. In the above-described example, the value of the electrostatic protection resistor is $R_S$=30Ω. On the contrary, in the output buffer circuit 1 shown in FIG. 8, the resistor 50 and the variable resistor circuit 30 are the electrostatic protection resistors which protect the P-type transistor 10, and the resistor 50 and the variable resistor circuit 40 are the electrostatic protection resistors which protect the N-type transistor 20 against the static electricity from the output node N2. The value of the electrostatic protection resistor is $R_S+R_{DP}=R_S+R_{DN}=50\Omega$. That is, according to the output buffer circuit 1 of the present embodiment, the value of the electrostatic protection resistor can be made larger than that of the output buffer circuit 101 of the comparative example.

In the output buffer circuit 1 shown in FIG. 5, the resistor 32-*i* (i is a number from 1 to n) is provided in the signal path between the P-type transistor 33-*i* and the output node N2, so that the resistor 50 and the resistor 32-*i* function as a protection resistor for protecting the P-type transistor 33-*i*. Since the resistor 42-*j* (j is a number from 1 to n) is provided in the signal path between the N-type transistor 43-*j* and the output node N2, the resistor 50 and the resistor 42-*j* function as a protection resistor for protecting the N-type transistor 43-*j*. The same is true for the output buffer circuit 1 shown in FIG. 2.

In the output buffer circuit 1 shown in FIG. 2, since the drain of the P-type transistor 10 is electrically coupled to the output node N2 via the resistor 32-1 and the resistor 50, even when at least one of the P-type transistors 33-2 to 33-*n* is out of order and is fixed to a nonconductive state, the output signal OUT at the low level can be output when the input signal PIN is at the high level. Similarly, in the output buffer circuit 1 shown in FIG. 2, since the drain of the N-type transistor 20 is electrically coupled to the output node N2 via the resistor 42-1 and the resistor 50, even when at least one of the N-type transistors 43-2 to 43-*n* is out of order and is fixed to a nonconductive state, the output signal OUT at the high level can be output when the input signal PIN is at the low level.

1-4. Modification Example

The output buffer circuit 1 of the above-described embodiment includes the variable resistor circuit 30 and the variable resistor circuit 40, but the variable resistor circuit 30 may be replaced to a resistor having a fixed resistance value if the adjustment of the rise time of the output signal OUT is unnecessary. Similarly, in the output buffer circuit 1 of the above-described embodiment, if the adjustment of the fall time of the output signal OUT is unnecessary, the variable resistor circuit 40 may be replaced to a resistor having a fixed resistance value.

2. Oscillator

Figure 9:
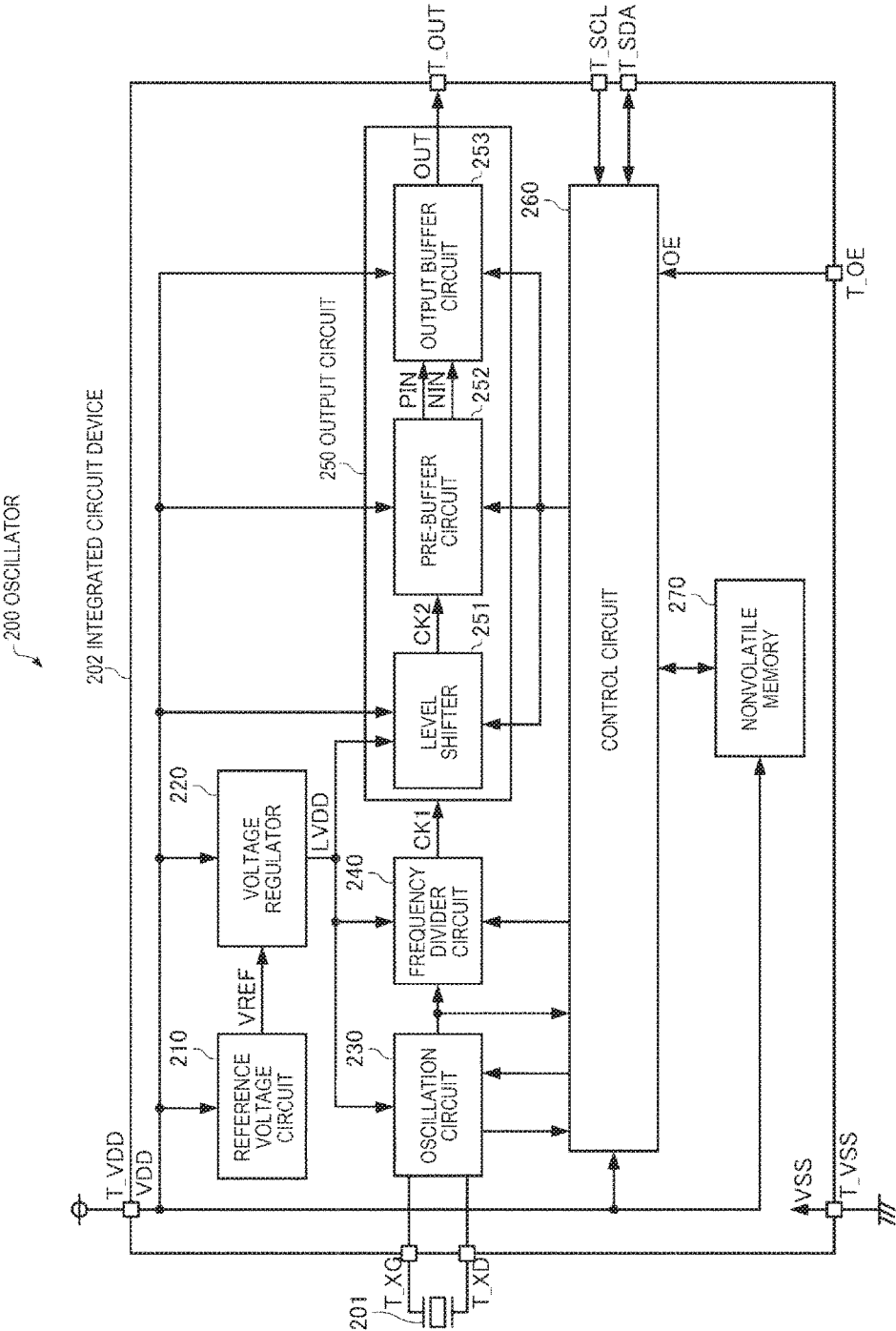
FIG. 9 is a functional block diagram of an oscillator of an embodiment.

FIG. 9 is a functional block diagram of an oscillator 200 of the present embodiment. As shown in FIG. 9, the oscillator 200 of the present embodiment is configured of a resonator 201 and an integrated circuit device 202.

As the resonator 201, for example, a quartz crystal resonator, a surface acoustic wave (SAW) resonant element, other piezoelectric resonance elements, and micro electro mechanical systems (MEMS) resonator, or the like can be used.

In the present embodiment, the integrated circuit device 202 is configured as a one-chip integrated circuit (IC) including a T_XG terminal, a T_XD terminal, a T_SCL terminal, a T_SDA terminal, a T_OE terminal, a T_VDD terminal, a T_VSS terminal, and a T_OUT terminal. The integrated circuit device 202 includes a reference voltage circuit 210, a voltage regulator 220, an oscillation circuit 230, a frequency divider circuit 240, an output circuit 250, a control circuit 260, and a nonvolatile memory 270. The integrated circuit device 202 may have a configuration in which some elements are omitted or changed, or other elements are added.

Each circuit of the integrated circuit device 202 operates with reference to the ground voltage VSS (0 V, for example) supplied via the T_VSS terminal.

The reference voltage circuit 210 generates a reference voltage VREF from the power supply voltage VDD supplied via the T_VDD terminal and outputs the reference voltage VREF to the voltage regulator 220. For example, the reference voltage circuit 210 is realized by a band-gap reference circuit and the like using a semiconductor band gap.

The voltage regulator 220 generates the power supply voltage LVDD based on the power supply voltage VDD and the reference voltage VREF. The voltage generated by the voltage regulator 220 becomes the power supply voltage of the oscillation circuit 230 and the frequency divider circuit 240.

The oscillation circuit 230 is coupled to one end of the resonator 201 via the T_XG terminal, and coupled to the other end of the resonator 201 via the T_XD terminal. The oscillation circuit 230 amplifies the output signal of the resonator 201 input via the T_XG terminal, and feeds the amplified signal back to the resonator 201 via the T_XD terminal to oscillate the resonator 201. The oscillation circuit 230 may have a temperature compensation function or a frequency conversion function. For example, the oscillation circuit 230 may perform frequency conversion on the signal obtained by amplifying the output signal of the resonator 201 using a fractional N-PLL circuit according to a frequency division ratio corresponding to the control signal from the control circuit 260 and output it. The oscillation circuit 230 outputs an oscillation signal which is a source of a signal input into an output buffer circuit 253 described later. The operation of the oscillation circuit 230 is controlled based on the control signal from the control circuit 260.

The frequency divider circuit 240 outputs a clock signal CK1 obtained by frequency-diving the oscillation signal output from the oscillation circuit 230 by a frequency division ratio corresponding to the control signal from the control circuit 260. The amplitude of the clock signal CK1 is substantially equal to the difference between the power supply voltage LVDD and the ground voltage VSS.

The output circuit 250 includes a level shifter 251, a pre-buffer circuit 252, and the output buffer circuit 253.

The level shifter 251 outputs a clock signal CK2 obtained by converting the clock signal CK1 so that the amplitude thereof is substantially equal to the difference between the power supply voltage VDD and the ground voltage VSS. The operation of the level shifter 251 is controlled based on the control signal from the control circuit 260.

The pre-buffer circuit 252 operates with the power supply voltage VDD and generates the input signals PIN and NIN of the output buffer circuit 253 based on the clock signal CK2. For example, the pre-buffer circuit 252 outputs the input signals PIN and NIN at the low level when the clock signal CK2 is at the high level, and outputs the input signals PIN and NIN at the high level when the clock signal CK2 is at the low level. The operation of the pre-buffer circuit 252 is controlled based on the control signal from the control circuit 260.

The output buffer circuit 253 operates with the power supply voltage VDD and generates the output signal OUT based on the input signals PIN and NIN. The rise time and the fall time of the output signal OUT change based on the control signal from the control circuit 260. The output signal OUT is output from the T_OUT terminal to the outside of the oscillator 200. The output buffer circuit 1 of the above-described embodiment is applied as the output buffer circuit 253.

The control circuit 260 has an interface circuit (not shown) for an inter-integrated circuit (I²C) bus, receives a serial data signal input via the T_SDA terminal in synchronization with a serial clock signal input from an external device (not shown) via the T_SCL terminal, and stores various data in the nonvolatile memory 270 according to the received serial data. The control circuit 260 generates each control signal based on various data stored in the nonvolatile memory 270.

When an output enable signal OE input from the external device (not shown) via the T_OE terminal is at the high level, the control circuit 260 operates the level shifter 251 and controls the pre-buffer circuit 252 to output the input signals PIN and NIN corresponding to the clock signal CK2. When the output enable signal OE is at the low level, the control circuit 260 stops the level shifter 251 and controls the pre-buffer circuit 252 to output the input signal PIN at the high level and the input signal NIN at the low level. When the input signal PIN is at the high level and the input signal NIN is at the low level, both the P-type transistor and the N-type transistor (not shown) of the output buffer circuit 253 are turned off, and the T_OUT terminal is at the high impedance.

The interface circuit of the control circuit 260 is not limited to the interface circuit for an I²C bus, but for example, may be an interface circuit for a serial peripheral interface (SPI) bus or the like.

According to the oscillator 200 of the above-described present embodiment, since the output buffer circuit 1 of the above-described embodiment is applied as the output buffer circuit 253, it is unnecessary to adjust the drive capability of the pre-buffer circuit 252, so that it is easy to adjust the rise time and the fall time of the output signal OUT. According to the oscillator 200 of the present embodiment, since the output buffer circuit 1 of the above-described embodiment is applied as the output buffer circuit 253, the through-current flowing from the power source to the ground in the output buffer circuit 253 is reduced, so that it is possible to reduce power consumption. According to the oscillator 200 of the present embodiment, since the output buffer circuit 1 of the above-described embodiment is applied as the output buffer circuit 253, it is possible to increase the resistance value of the electrostatic protection resistor against the static electricity from the T_OUT terminal.

3. Electronic Apparatus

Figure 10:
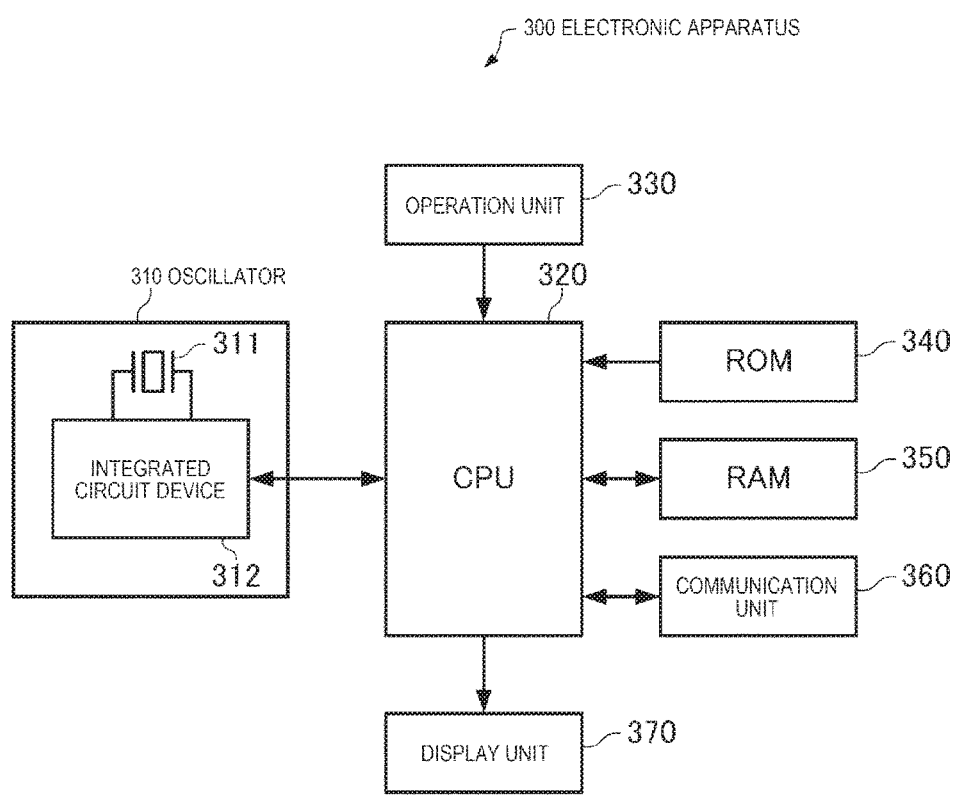
FIG. 10 is a functional block diagram of an electronic apparatus of an embodiment.
Figure 11:
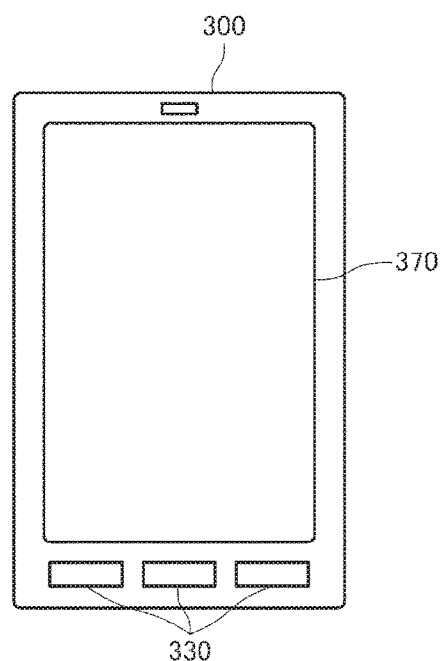
FIG. 11 is a diagram showing an example of an appearance of the electronic apparatus of the embodiment.

FIG. 10 is a functional block diagram showing an example of a configuration of an electronic apparatus of the present embodiment. FIG. 11 is a diagram showing an example of an appearance of a smartphone which is the electronic apparatus of the present embodiment.

An electronic apparatus 300 of the present embodiment is configured of an oscillator 310, a central processing unit (CPU) 320, an operation unit 330, a read only memory (ROM) 340, a random access memory (RAM) 350, a communication unit 360, and a display unit 370. The electronic apparatus of the present embodiment may have a configuration in which some constituents (each unit) of FIG. 10 are omitted or changed, or other constituents are added.

The oscillator 310 includes a resonator 311 and an integrated circuit device 312. The integrated circuit device 312 oscillates the resonator 311 to generate an oscillation signal. The oscillation signal is output from an external terminal of the oscillator 310 to the CPU 320. The integrated circuit device 312 has an output buffer circuit (not shown) and outputs an output signal based on the oscillation signal output from the resonator 311 from the output buffer circuit.

The CPU 320 (processing unit) is a processing unit which performs various calculation processing and control processing using the signal output from the oscillator 310 as a clock signal according to a program stored in the ROM 340 and the like. Specifically, the CPU 320 performs various processing according to an operation signal from the operation unit 330, processing of controlling the communication unit 360 to perform data communication with the external device, processing of transmitting a display signal to display various information on the display unit 370, and the like.

The operation unit 330 is an input device configured of operation keys, button switches, and the like, and outputs an operation signal corresponding to an operation of a user to the CPU 320.

The ROM 340 is a storage unit which stores programs, data, and the like for the CPU 320 to perform various calculation processing and control processing.

The RAM 350 is used as an operation area of the CPU 320, and is a storage unit which temporarily stores programs and data read from the ROM 340, data received from the operation unit 330, calculation results executed by the CPU 320 according to various programs, and the like.

The communication unit 360 performs various controls for establishing data communication between the CPU 320 and the external device.

The display unit 370 is a display device configured of a liquid crystal display (LCD) and the like and displays various information based on the display signal input from the CPU 320. A touch panel functioning as the operation unit 330 may be provided on the display unit 370.

According to the electronic apparatus 300 of the present embodiment, since the output buffer circuit 1 of the above-described embodiment is applied, for example, as an output buffer circuit of the integrated circuit device 312 of the oscillator 310, it is unnecessary to adjust the drive capability of a pre-buffer circuit (not shown) which drives the output buffer circuit, so that it is easy to adjust the rise time and the fall time of the output signal of the oscillator 310.

Various electronic apparatuses are conceivable as such an electronic apparatus 300, and examples thereof include a personal computer (for example, a portable personal computer, a laptop personal computer, a tablet personal computer), a mobile terminal such as a smartphone or a cellular phone, a digital camera, an ink jet type ejection device (for example, an ink jet printer), a storage area network device such as a router and a switch, a local area network device, a device for a mobile terminal base station, a television, a video camera, a video recorder, a car navigation device, a real time clock device, a pager, an electronic organizer (including an electronic organizer with communication function), an electronic dictionary, an electronic calculator, an electronic game machine, a game controller, a word processor, a workstation, a video phone, a security television monitor, an electronic binocular, a POS terminal, medical equipment (for example, an electronic thermometer, a sphygmomanometer, a blood glucose meter, an electrocardiogram measuring device, ultrasonic diagnostic equipment, an electronic endoscope), a fish finder, various measuring devices, instruments (for example, instruments of a vehicle, an aircraft, a ship), a flight simulator, a head mounted display, a motion trace, a motion tracking, a motion controller, a PDR (pedestrian location direction measurement), and the like.

4. Vehicle

Figure 12:
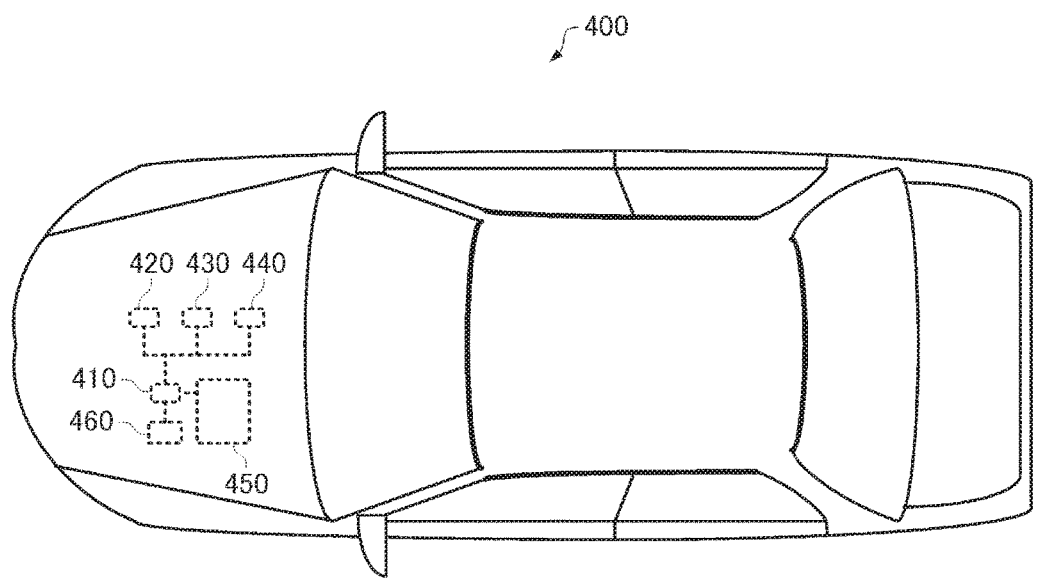
FIG. 12 is a diagram showing an example of a vehicle of an embodiment.

FIG. 12 is a diagram (top view) showing an example of a vehicle of the present embodiment. A vehicle 400 shown in FIG. 12 is configured of an oscillator 410, controllers 420, 430, and 440 which perform various controls such as an engine system, a brake system, and a keyless entry system, a battery 450, and a backup battery 460. The vehicle of the present embodiment may have a configuration in which some constituents (each unit) of FIG. 12 are omitted, or other constituents are added.

The oscillator 410 includes an integrated circuit device and a resonator (not shown), and the integrated circuit device oscillates the resonator to generate an oscillation signal. The integrated circuit device has an output buffer circuit (not shown) and outputs an output signal based on the oscillation signal output from the resonator from the output buffer circuit. The output signal is supplied from an external terminal of the oscillator 410 to the controllers 420, 430, and 440, and is used as, for example, a clock signal.

The battery 450 supplies power to the oscillator 410 and the controllers 420, 430, and 440. The backup battery 460 supplies power to the oscillator 410 and the controllers 420, 430, and 440 when the output voltage of the battery 450 falls below the threshold value.

Since the output buffer circuit 1 of the above-described embodiment is applied, for example, as an output buffer circuit of the integrated circuit device of the oscillator 410, it is unnecessary to adjust the drive capability of a pre-buffer circuit (not shown) which drives the output buffer circuit, so that it is easy to adjust the rise time and the fall time of the output signal of the oscillator 410, and a highly reliable vehicle can be realized.

Various vehicles are conceivable as such a vehicle 400, and examples thereof include an automobile (including an electronic car), an aircraft such as a jet machine or a helicopter, a ship, a rocket, an artificial satellite, and the like.

The present disclosure is not limited to the present embodiment, and various modifications can be made within the scope of the present disclosure.

The above-described embodiments and modification examples are merely examples and are not intended to be limited thereto. For example, the embodiments and the modification examples may be appropriately combined.

The present disclosure includes substantially the same configurations as those configuration described in the embodiments (for example, configurations having the same functions, methods, and results, or configurations having the same objects and effects). The present disclosure also includes configurations in which portions not being essential of the configuration described in the embodiments are substituted. The present disclosure also includes configurations that can achieve the same effects or objects as those of the configurations described in the embodiments. The present disclosure also includes configurations in which public technology is added to the configurations described in the embodiments.

What is claimed is:

1. An output buffer circuit comprising:
an output node;
a P-type transistor that receives a first signal input to the output buffer circuit;
an N-type transistor that receives a second signal input to the output buffer circuit; and
a first variable resistor circuit provided in a signal path between a drain of the P-type transistor and the output node, wherein
the first variable resistor circuit includes (i) a first resistor directly connected to the drain of the P-type transistor and the output node, (ii) a second resistor, and (iii) a first switching circuit coupled in series to the second resistor, and
the first resistor is coupled in parallel to the second resistor and the first switching circuit; and
a second variable resistor circuit provided in a signal path between a drain of the N-type transistor and the output node, wherein
the second variable resistor circuit includes (i) a third resistor directly connected to the drain of the N-type transistor and the output node, (ii) a fourth resistor, and (iii) a second switching circuit coupled in series to the fourth resistor, and
the third resistor is coupled in parallel to the fourth resistor and the second switching circuit.

2. The output buffer circuit according to claim 1, wherein the first switching circuit includes a first transistor, and the second resistor is provided in a signal path between the first transistor and the output node.

3. The output buffer circuit according to claim 2, wherein the second switching circuit includes a second transistor, and
the fourth resistor is provided in a signal path between the second transistor and the output node.

4. An oscillator comprising:
the output buffer circuit according to claim 1; and
an oscillation circuit that outputs an oscillation signal as a source of the first signal input to the output buffer circuit.

5. An electronic apparatus comprising the output buffer circuit according to claim 1.

6. A vehicle comprising the output buffer circuit according to claim 1.

* * * * *